United States Patent
Yang et al.

(10) Patent No.: US 8,669,651 B2
(45) Date of Patent: Mar. 11, 2014

(54) PACKAGE-ON-PACKAGE STRUCTURES WITH REDUCED BUMP BRIDGING

(75) Inventors: Chung-Ying Yang, Taoyuan (TW);
Chao-Wen Shih, Zhubei (TW); Hao-Yi Tsai, Hsin-Chu (TW); Hsien-Wei Chen, Sinying (TW); Mirng-Ji Lii, Sinpu Township (TW); Tzuan-Horng Liu, Longtan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 575 days.

(21) Appl. No.: 12/843,549

(22) Filed: Jul. 26, 2010

(65) Prior Publication Data

US 2012/0018877 A1  Jan. 26, 2012

(51) Int. Cl.
*H01L 23/538* (2006.01)

(52) U.S. Cl.
USPC ..... 257/686; 257/737; 257/777; 257/E23.175

(58) Field of Classification Search
USPC .......................................... 257/737, 777, 686
See application file for complete search history.

(56) References Cited

U.S. PATENT DOCUMENTS

| | | | |
|---|---|---|---|
| 2009/0146314 A1* | 6/2009 | Akaike et al. | 257/777 |
| 2009/0174081 A1* | 7/2009 | Furuta | 257/777 |
| 2009/0309212 A1* | 12/2009 | Shim et al. | 257/700 |
| 2010/0244230 A1* | 9/2010 | Oi | 257/692 |

* cited by examiner

*Primary Examiner* — Thanh Nguyen
(74) *Attorney, Agent, or Firm* — Slater & Matsil, L.L.P.

(57) ABSTRACT

A device includes a package substrate including a first non-reflowable metal bump extending over a top surface of the package substrate; a die over and bonded to the package substrate; and a package component over the die and bonded to the package substrate. The package component includes a second non-reflowable metal bump extending below a bottom surface of the package component. The package component is selected from the group consisting essentially of a device die, an additional package substrate, and combinations thereof. A solder bump bonds the first non-reflowable metal bump to the second non-reflowable metal bump.

15 Claims, 9 Drawing Sheets

PACKAGE-ON-PACKAGE STRUCTURES WITH REDUCED BUMP BRIDGING

TECHNICAL FIELD

This disclosure relates generally to integrated circuits, and more particularly to package-on-package structures with reduced bump bridging.

BACKGROUND

In order to enhance functionality and input/output (I/O) count, package-on-package (PoP) structures were invented, so that multiple dies may be stacked and interconnected as an integrated packaging assembly. Even though PoP structures allow for space saving, there were still some barriers that need to be overcome.

FIG. 1 illustrates a conventional PoP structure, which includes package substrate 100, and die 102 bonded onto package substrate 100. Package substrate 104 is also bonded to package substrate 100 through solder bumps 110. Further, package substrate 104 has dies 106 bonded thereon. Package substrate 100 may be bonded on a printed circuit board (PCB, not shown).

In the PoP structure as shown in FIG. 1, due to the existence of die 102 and the possible molding compound 112, the distance between package substrates 100 and 104 is increased. As a result, the height of solder bumps 110 is increased, which further causes the increase in the lateral dimensions of solder bumps 110. This results in several problems. With the big solder bumps 110, the count of solder bumps 110 that may be accommodated in the PoP structure is low. To incorporate more solder bumps 110 in order to meet the packaging requirements, the distance between neighboring solder bumps 110 needs to be kept minimal. However, this incurs the risk of bridging between solder bumps 110. Various approaches have been explored to solve these problems, including, for example, forming elongated solder bumps 110 whose heights are significantly greater than their lateral dimensions. However, this posts a demanding requirement to the accuracy of the manufacturing process, and the respective manufacturing process is complicated. In addition, the risk of bridging still exists.

SUMMARY

In accordance with one aspect, a device includes a package substrate including a first non-reflowable metal bump extending over a top surface of the package substrate; a die over and bonded to the package substrate; and a package component over the die and bonded to the package substrate. The package component includes a second non-reflowable metal bump extending below a bottom surface of the package component. The package component is selected from the group consisting essentially of a device die, an additional package substrate, and combinations thereof. A solder bump bonds the first non-reflowable metal bump to the second non-reflowable metal bump.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel package-on-package (PoP) structure and the method of forming the same are provided. The intermediate stages of manufacturing an embodiment are illustrated. The variations of the embodiment are discussed. Throughout the various views and illustrative embodiments, like reference numbers are used to designate like elements.

Figure 1:
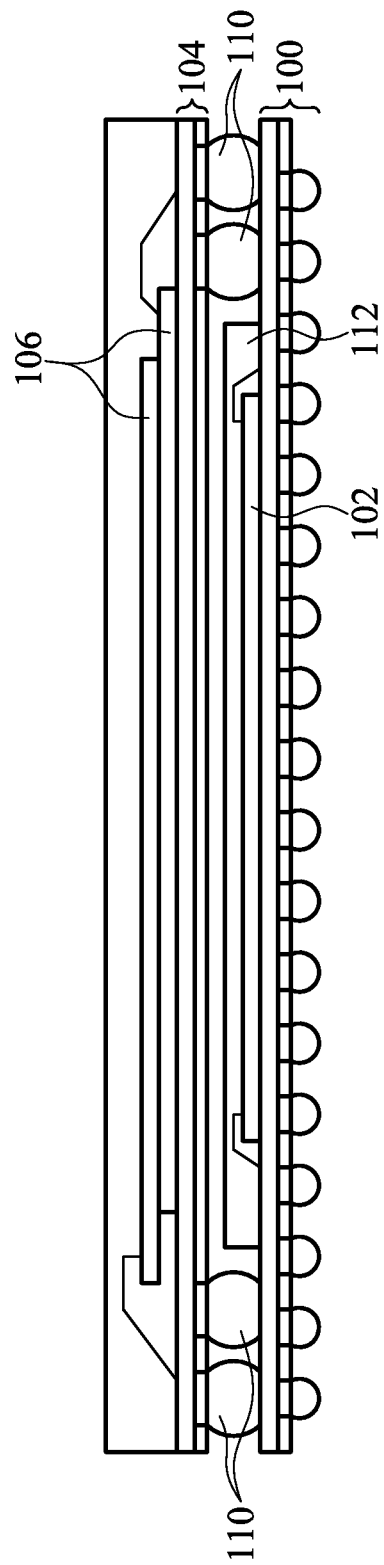
FIG. 1 illustrates a conventional package-on-package (PoP) structure.
Figure 2:
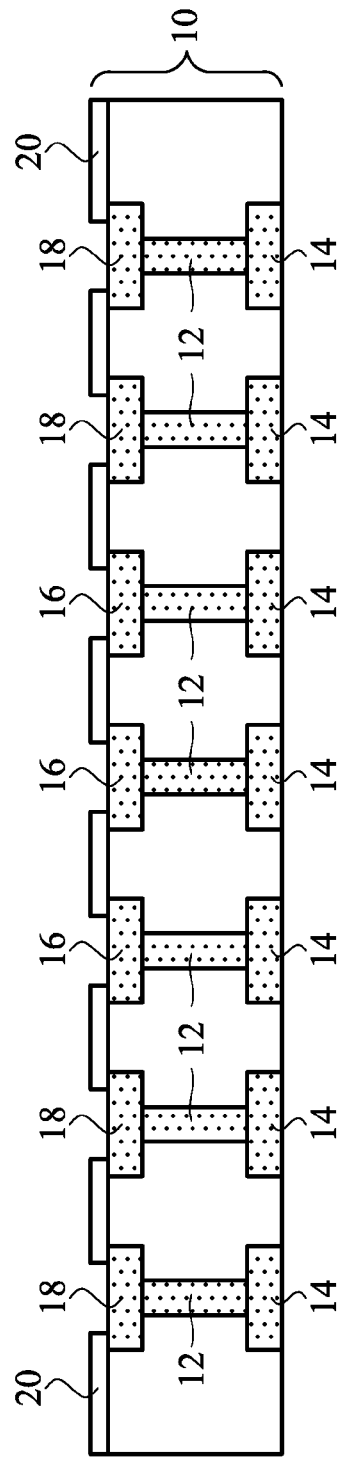
FIGS. 2 through 8B are cross-sectional views of intermediate stages in the manufacturing of a PoP structure in accordance with various embodiments.

FIG. 2 illustrates a portion of package substrate 10. In an embodiment, package substrate 10 does not include active devices such as transistors therein. Further, connection lines 12 are formed in package substrate 10 and interconnect metal features on opposite sides of package substrate 10, wherein the metal features may include metal pads 14, 16 and 18. Although connection lines 12 (alternatively referred to as redistribution lines) are illustrated as being straight lines, they may include metal lines and vias formed in more than one dielectric layers (not shown). Metal pads 16 and 18 may be formed of copper (for example, pure or substantially pure copper), aluminum, silver, and/or alloys thereof. An additional barrier layer (not shown) may be formed over each of metal pads 16 and 18, wherein the barrier layer may be formed of nickel or nickel alloys, although other metals may be used. In an embodiment, dielectric layer 20 is formed on the top surface of package substrate 10 and covers edge portions of metal pads 16 and 18, while the center portions of metal pads 16 and 18 are exposed.

Figure 3:
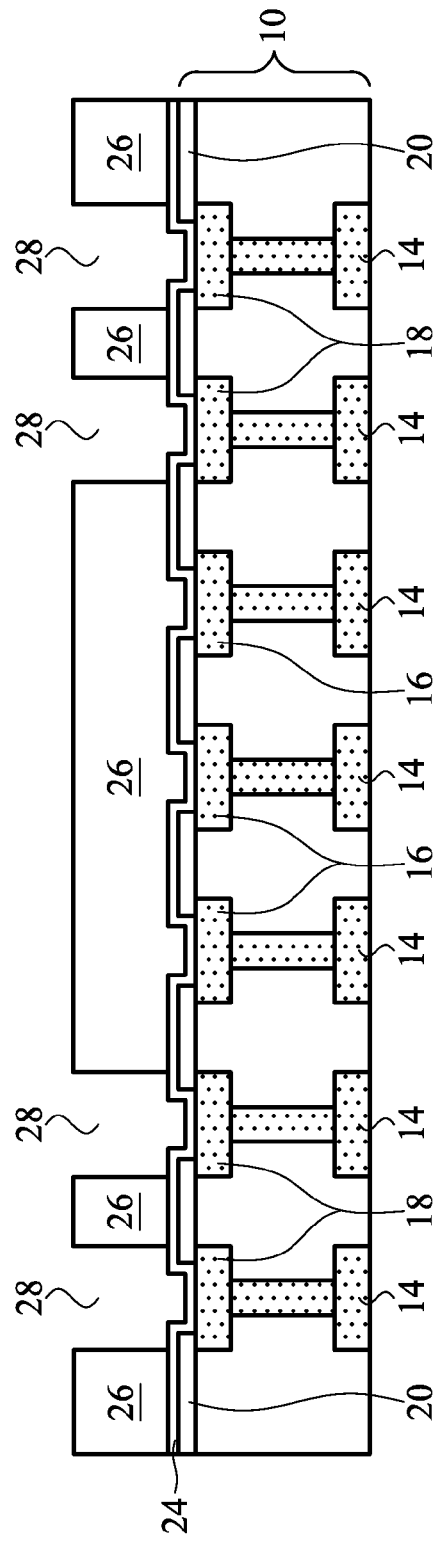

Next, as shown in FIG. 3, under-bump-metallurgy (UBM) 24 is blanket formed on dielectric layer 20, and contact metal pads 16 and 18. UBM 24 may include a titanium layer and a copper layer over the titanium layer (not shown). Mask 26, which may be formed of a dry film or a photo resist, is then formed on UBM 24, and is patterned. The patterned mask 26 covers metal pads 16 and the overlying portions of dielectric layer 20 and UBM 24. Openings 28 are formed in mask 26, so that the portions of UBM 24 directly over metal pads 18 are exposed.

Figure 4:
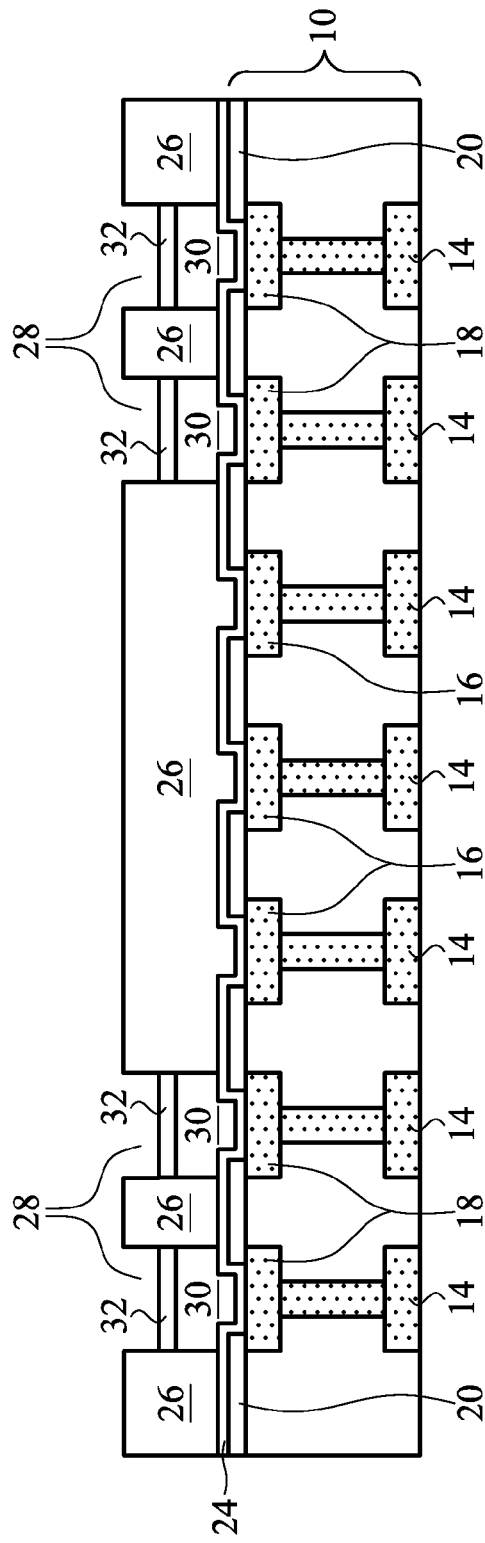

Referring to FIG. 4, metal bumps 30 are formed in openings 28, for example, using a selective plating method such as electroless plating. Accordingly, metal bumps 30 extend over the top surface of dielectric layer 20. Metal bumps 30 may be formed of substantially pure copper, although other metals may be added or used. Accordingly, metal bumps 30 are alternatively referred to as non-reflowable metal bumps since they cannot be reflowed in the subsequent reflow of solder bumps. Pre-solder bumps 32 (alternatively referred to as being solder caps) may be optionally formed on the top surfaces of metal bumps 30, and may be formed of SnAgCu, for example, although other solder materials including lead-containing or lead-free solder materials may also be used.

Figure 5:
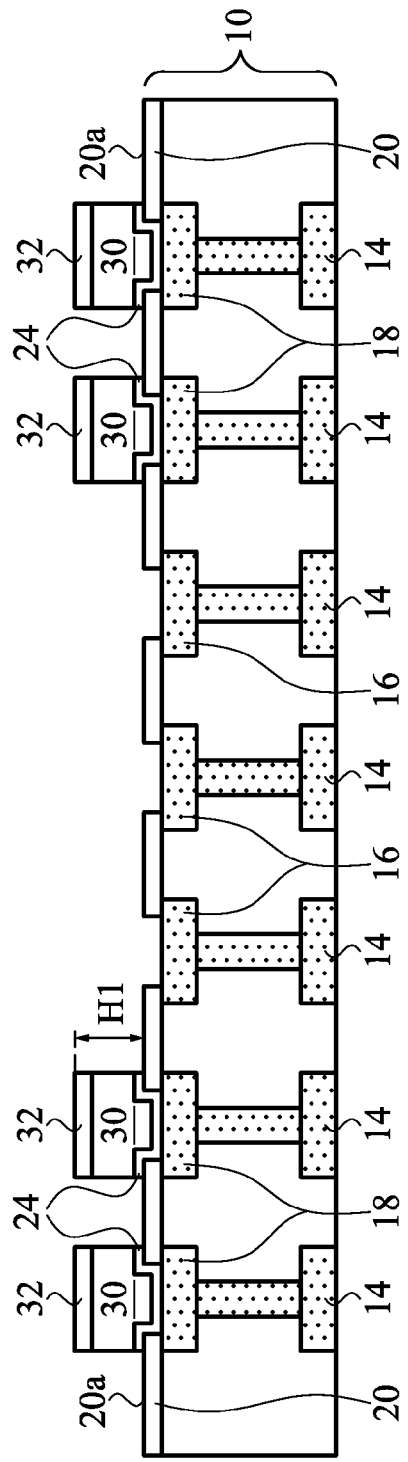

In FIG. 5, mask 26 is removed, followed by an etching step to remove exposed portions of UBM 24, while metal bumps 30 are left. Throughout the description, the remaining portions of UBM 24 are also considered as parts of metal bumps 30. In an exemplary embodiment, height H1 of the portions of metal bumps 30 beyond (over) the top surface of dielectric layer 20 is greater than about 30 μm, or even greater than about 50 μm, although height H1 may be greater or smaller. In this case, top surface 20a of dielectric layer 20 is also the top surface of package substrate 10, and metal bumps 30 accordingly extend over the top surface of package substrate 10.

Figure 6:
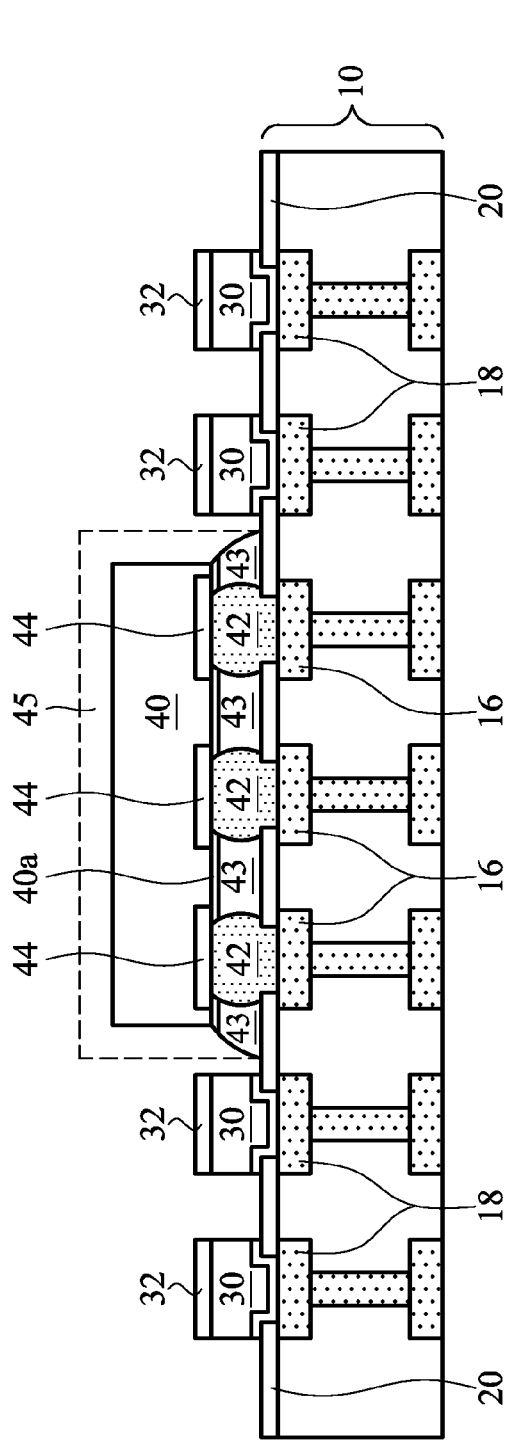

Referring to FIG. 6, die 40 is bonded to package substrate 10, for example, through flip-chip bonding. Solder bumps 42 are used to bond metal pads 16 to bond pads 44 in die 40. Die 40 may be a device die including integrated circuits such as transistors (not shown) therein. In an embodiment, die 40 is bonded to a center region of package substrate 10, with metal bumps 30 being formed in an edge region(s) of package substrate 10. Metal bumps 30 may be arranged to surround die 40. In an embodiment, bond pads 44 are inside die 40, and do not protrude beyond surface 40a of die 40. Underfill 43 may be disposed between package substrate 10 and die 40. Further, molding compound 45 may optionally be formed to cover die 40.

Figure 7:
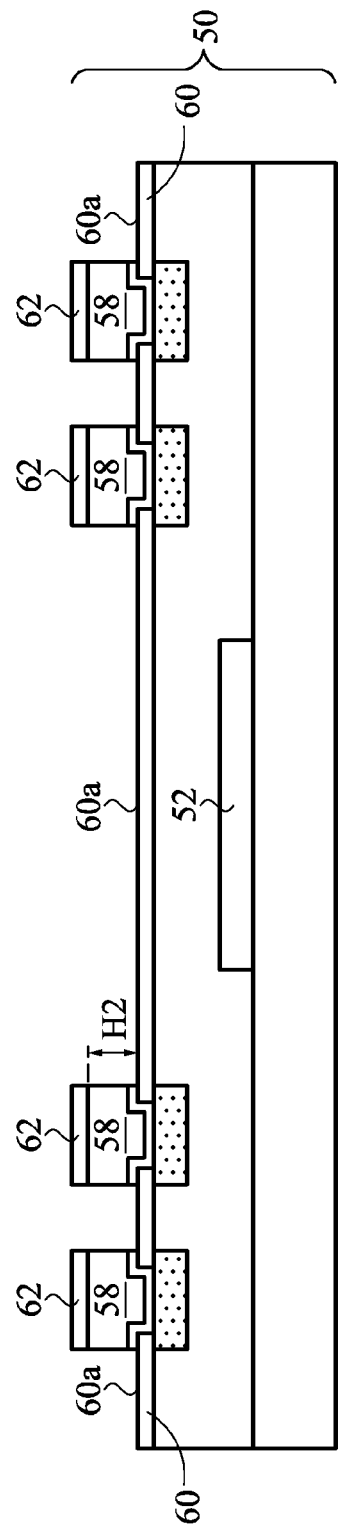
Figure 8A:
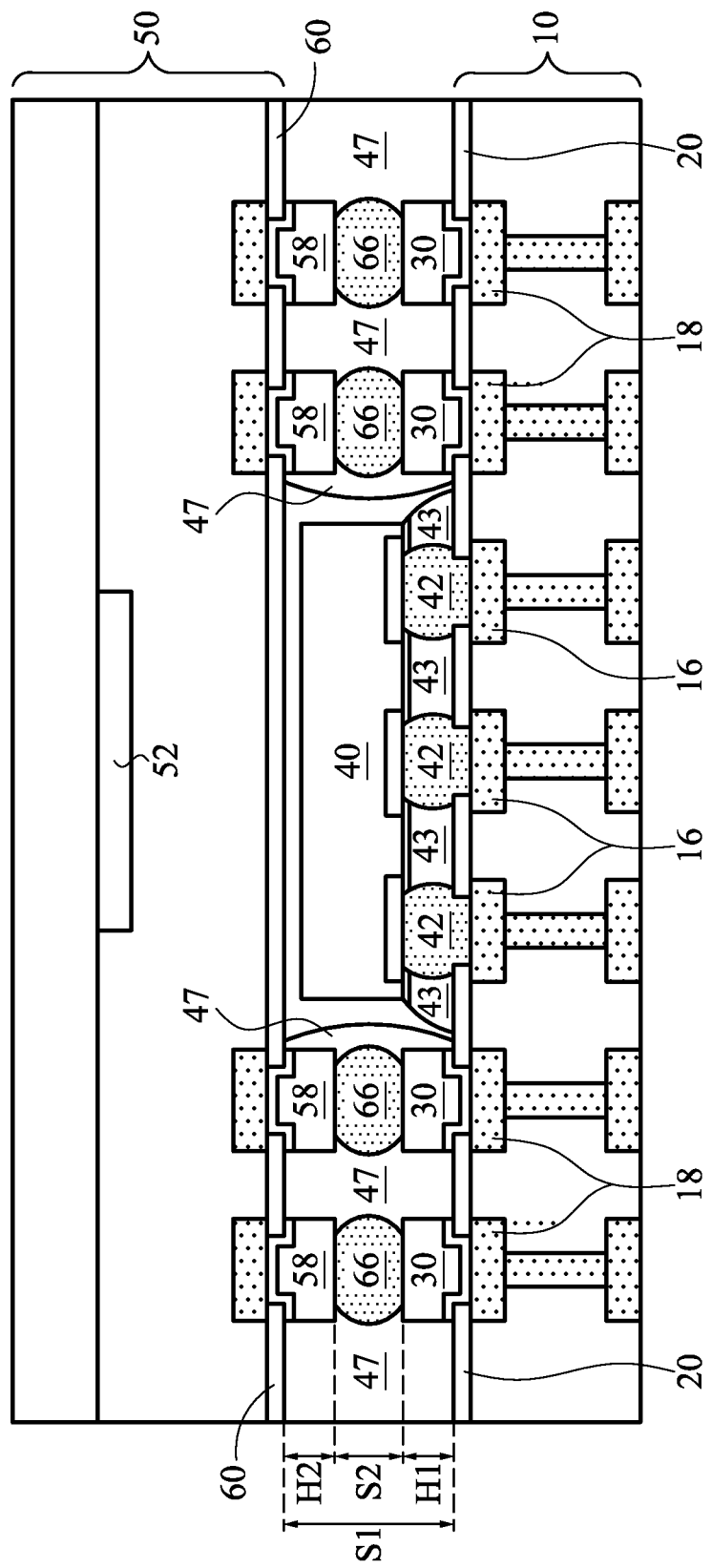
Figure 8B:
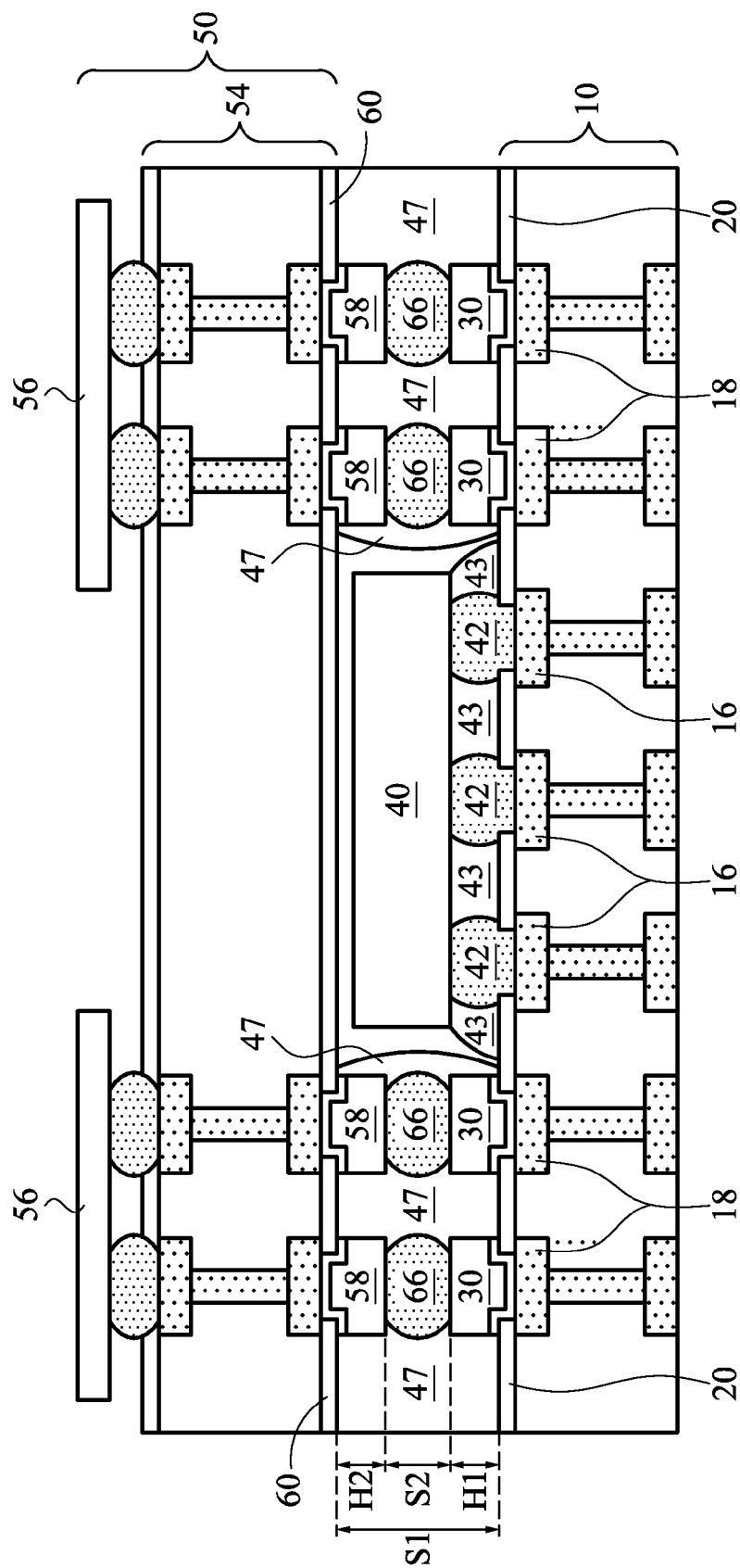

FIG. 7 illustrates a cross-sectional view of package component 50. In an embodiment, as shown in FIGS. 7 and 8A, package component 50 is a device die comprising active devices 52 such as transistors therein. In alternative embodiments, as shown in FIG. 8B, package component 50 comprises package substrate 54, and top dies 56 over and bonded to package substrate 54. The bonding between package substrates 54 and top dies 56 may be flip-chip bonding, wire-bonding, or the like.

Referring back to FIG. 7, package component 50 further includes metal bumps 58 that extend beyond dielectric layer 60, which is formed at the surface of package component 50. Throughout the description, surface 60a of dielectric layer 60 is also referred to as a surface of package component 50. Height H2 of the portions of metal bumps 58 beyond (over) top surface 60a may be greater than about 30 μm, or even greater than about 50 μm, although height H2 may be greater or smaller. In an embodiment, metal bumps 58 are copper bumps, although other metallic materials may be used. Accordingly, metal bumps 58 are also alternatively referred to as non-reflowable metal bumps. Solder bumps 62 may be formed on the top surfaces of metal bumps 58. Solder bumps 62 may be formed of SnAg, for example, although other solder materials may be used. The process for forming metal bumps 58 and solder bumps 62 may be essentially the same as for forming metal bumps 30 and pre-solder bumps 32, respectively, as shown in FIGS. 3 through 5.

Referring to FIGS. 8A and 8B, package component 50 is bonded to package substrate 10. Pre-solder bumps 32 and solder bumps 62 are joined by a re-flow step to form solder bumps 66. Die 40 is accordingly located between package component 50 and package substrate 10, and is not bonded to package component 50. The space between package component 50 and package substrate 10 is great enough to accommodate die 40 and solder bumps 42. In FIG. 8A, package component 50 is a device die with active devices 52 (which may include transistors) therein. In FIG. 8B, package component 50 includes package substrate 54 and device dies 56 bonded to package substrate 54. In other embodiments, package component 50 may includes more dies and/or package substrates bonded together. Underfill 47 may be disposed between package component 50 and package substrate 10, and contact solder bumps 66 and dielectric layers 20 and 60.

Figure 9:
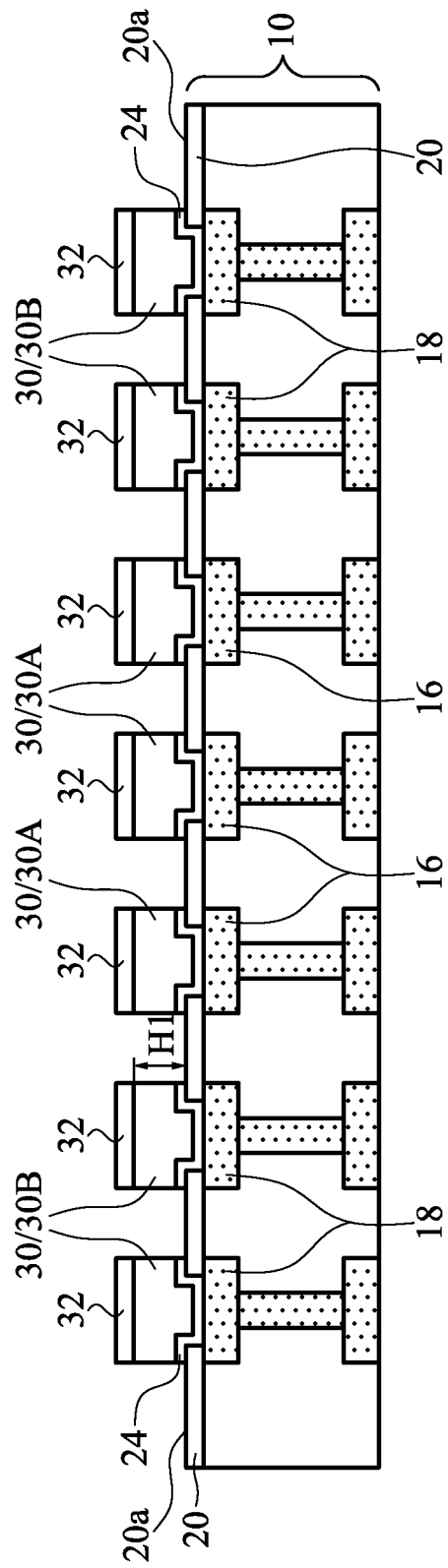
FIGS. 9 through 11 are cross-sectional views of intermediate stages in the manufacturing of a PoP structure in accordance with alternative embodiments.
Figure 10:
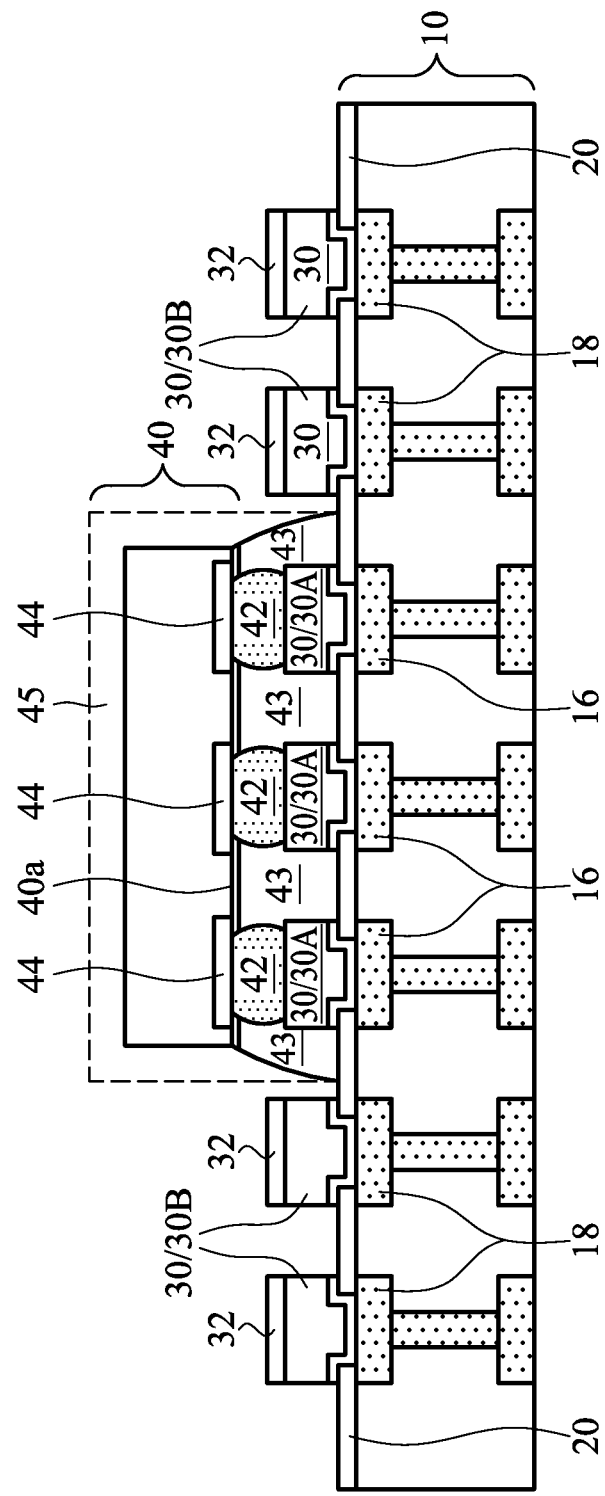
Figure 11:
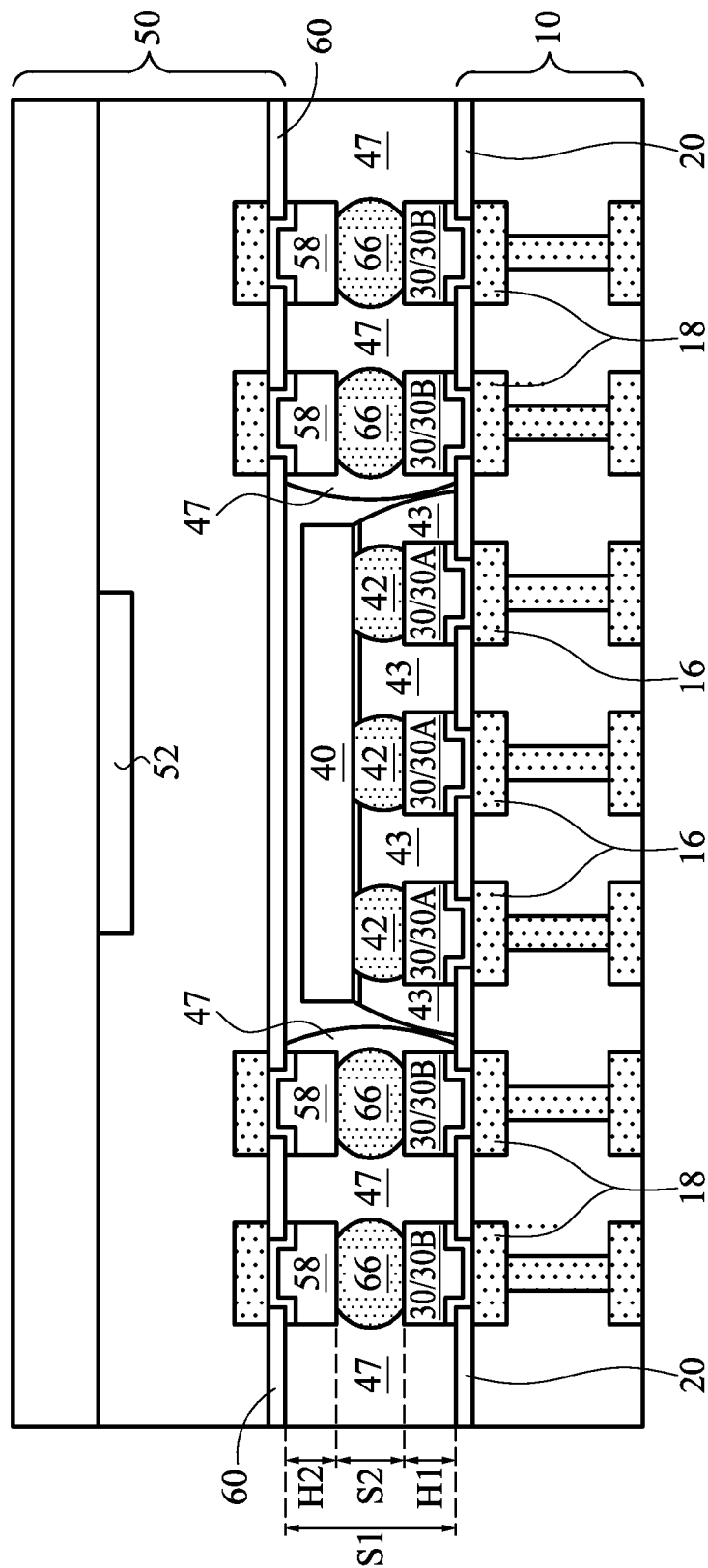

FIGS. 9 through 11 illustrate the cross-sectional views of intermediate stages in the manufacturing of a PoP structure in accordance with various alternative embodiments. Unless specified otherwise, the reference numerals in these embodiments represent like elements in the embodiments illustrated in FIGS. 2 through 8B. Referring to FIG. 9, metal bumps 30 (including metal bumps 30A and 30B) are formed on the surface of package substrate 10, and optional pre-solder bumps 32 are formed. Metal bumps 30A and 30B may be formed simultaneously using essentially the same process as shown in FIGS. 3 through 5. Again, metal bumps 30 extend beyond/over top surface 20a of dielectric layer 20, which top surface 20a is also the top surface of package substrate 10. Height H1 may be greater than about 30 μm, for example.

Next, as shown in FIG. 10, die 40 is bonded onto package substrate 10, and through metal bumps 30A. Die 40 may include metal pads 44 therein, wherein metal pads 44 may be recessed from surface 40a of die 40. Underfill 43 and optional molding compound 45 may then be disposed. FIG. 11 illustrates the bonding of package component 50 to package substrate 10, wherein metal bumps 58 are bonded to metal bumps 30B. Again, die 40 is located between package component 50 and package substrate 10, and is not bonded to package component 50. Package component 50 may be a device die including active devices therein, as shown in FIGS. 8A and 11, or, alternatively, package component 50 may include package substrate 54 and one or more die 56 bonded to package substrate 54, similar to what are shown in FIG. 8B. Underfill 47 may be disposed between package substrate 10 and package component 50 to protect metal bumps 66, further, under fill 47 contacts dielectric layers 20 and 60.

In the embodiments, by forming metal bumps 30 and 58 (FIGS. 8a, 8B, and 11), which extend beyond the surfaces of the respective package substrate and package component, the height of solder bumps 66 is reduced from the spacing S1 between package substrate 10 and package component 50 to S2, which is equal to (S1−H1−H2), with heights H1 and H2 being the heights of metal bumps 30 and 58, respectfully. With the reduced vertical size of metal bumps 66, the required lateral sizes and pitches of metal bumps 66 may be reduced. Accordingly, there will be a smaller possibility of the bridging between metal bumps 66. The count of metal bumps 66 may also be increased.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a package substrate comprising:
a first dielectric layer, wherein the first dielectric layer is the topmost dielectric layer of the package substrate;
an under-bump metallurgy (UBM) comprising a first portion extending over a top surface of the first dielectric layer, and a second portion extending into the first dielectric layer; and
a first non-reflowable metal bump over the UBM and extending over the top surface of the first dielectric layer;
a die over and bonded to the package substrate;
a package component over the die and bonded to the package substrate, wherein the package component comprises:
an additional device die; and
a second non-reflowable metal bump at a surface of the additional device die, wherein the second non-reflowable metal bump extends below a bottom surface of the package component; and
a solder bump bonding the first non-reflowable metal bump to the second non-reflowable metal bump.

2. The device of claim 1, wherein the die is not bonded to the package component.

3. The device of claim 1, wherein the package component comprises a second dielectric layer, with the first and the second non-reflowable metal bumps extending into the space between the first and the second dielectric layers, wherein the second dielectric layer is the lowest dielectric layer of the package component, and wherein the device further comprises an underfill between and contacting the first and the second dielectric layers.

4. The device of claim 3, wherein the first non-reflowable metal bump comprises a portion extending into the first dielectric layer, and wherein the second non-reflowable metal bump comprises a portion extending into the second dielectric layer.

5. The device of claim 1, wherein the die is bonded to the package substrate through metal pads in the package substrate and a plurality of additional solder bumps, and wherein no non-reflowable metal bump is formed over the top surface of the first dielectric layer and bonding the plurality of additional solder bumps to the package substrate.

6. The device of claim 1, wherein the package substrate further comprises a third non-reflowable metal bump extending over the top surface of the package substrate, and wherein the third non-reflowable metal bump is bonded to the die.

7. A device comprising:
a package substrate comprising:
a first dielectric layer; and
a first plurality of copper bumps, each comprising a first portion extending into the first dielectric layer, and a second portion extending over a top surface of the first dielectric layer;
a device die over and bonded to the package substrate through a first plurality of solder bumps;
a package component over the device die and bonded to the package substrate, wherein the package component comprises an additional device die, with the additional device die comprising:
a second dielectric layer; and
a second plurality of copper bumps, each comprising a first portion extending into the second dielectric layer, and a second portion extending below a bottom surface of the second dielectric layer; and
a second plurality of solder bumps bonding the first plurality of copper bumps to the second plurality of copper bumps.

8. The device of claim 7 further comprising an underfill between and contacting both the first and the second dielectric layers.

9. The device of claim 7, wherein the package component comprises a device die.

10. The device of claim 7, wherein the package component comprises an additional package substrate, and an additional device die bonded to the additional package substrate, and wherein the second dielectric layer is in the additional package substrate.

11. The device of claim 7, wherein the device die is not bonded to the package component.

12. The device of claim 7, wherein the device die does not comprise any copper bump bonded to the package substrate and extending below a bottom surface of the device die, wherein the bottom surface faces the package substrate.

13. The device of claim 7, wherein the package substrate comprises a third plurality of copper bumps extending over the top surface of the first dielectric layer, and wherein the third plurality of copper bumps is bonded to the device die.

14. The device of claim 7, wherein the package component comprises an additional device die, with the second dielectric layer being a portion of the additional device die.

15. The device of claim 7, wherein the first dielectric layer is the topmost dielectric layer of the package substrate, and wherein the second dielectric layer is the lowest dielectric layer of the package component.

* * * * *